(12) United States Patent
Hirata

(10) Patent No.: US 8,692,589 B2
(45) Date of Patent: Apr. 8, 2014

(54) SEMICONDUCTOR ELEMENT DRIVING CIRCUIT AND SEMICONDUCTOR DEVICE

(75) Inventor: Daisuke Hirata, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 38 days.

(21) Appl. No.: 13/349,147

(22) Filed: Jan. 12, 2012

(65) Prior Publication Data

US 2012/0299634 A1 Nov. 29, 2012

(30) Foreign Application Priority Data

May 26, 2011 (JP) ................. 2011-117820

(51) Int. Cl.
*H03B 1/00* (2006.01)
*H03K 3/00* (2006.01)

(52) U.S. Cl.
USPC ........... 327/109; 327/108; 327/110; 327/111; 327/112

(58) Field of Classification Search
USPC .......................................... 327/108, 109, 112
See application file for complete search history.

(56) References Cited

U.S. PATENT DOCUMENTS 7,560,968 B2 * 7/2009 Lee ................................ 327/263
2012/0153998 A1 * 6/2012 Kitamura et al. ............. 327/109

FOREIGN PATENT DOCUMENTS

| JP | H03-265460 A | 10/1991 |
|---|---|---|
| JP | 2000-333442 A | 11/2000 |
| JP | 2004-194426 A | 7/2004 |
| JP | 2006-129595 A | 5/2006 |
| JP | 2009-44304 | 2/2009 |
| JP | 2010-226835 | 10/2010 |

OTHER PUBLICATIONS

Kitamura et al., Gate Drive Circuit, Mar. 24, 2011, WO 2011/033733.*
Office Action issued Oct. 1, 2013 in Japanese Patent Application No. 2011-117820 filed May 26, 2011 (with English Translation).

* cited by examiner

*Primary Examiner* — John Poos
(74) *Attorney, Agent, or Firm* — Oblon, Spivak, McClelland, Maier & Neustadt, L.L.P.

(57) ABSTRACT

A driving circuit outputs an output voltage as a driving signal to the gate of a semiconductor element based on a control signal given from an input circuit. The output voltage is at "H" (ON level) if it is determined by a power supply voltage VCC, and is at "L" (OFF level) if it is determined by a ground voltage GND. A reference power supply section includes a series connection of resistors. The reference power supply section obtains a voltage determined by dividing a potential difference between the power supply voltage VCC and the ground voltage GND by a predetermined dividing ratio (resistance ratio between the resistors) as a reference voltage. A buffer circuit applies an output voltage as a reference signal determined by the reference voltage to the source of the semiconductor element.

9 Claims, 11 Drawing Sheets

F I G . 5
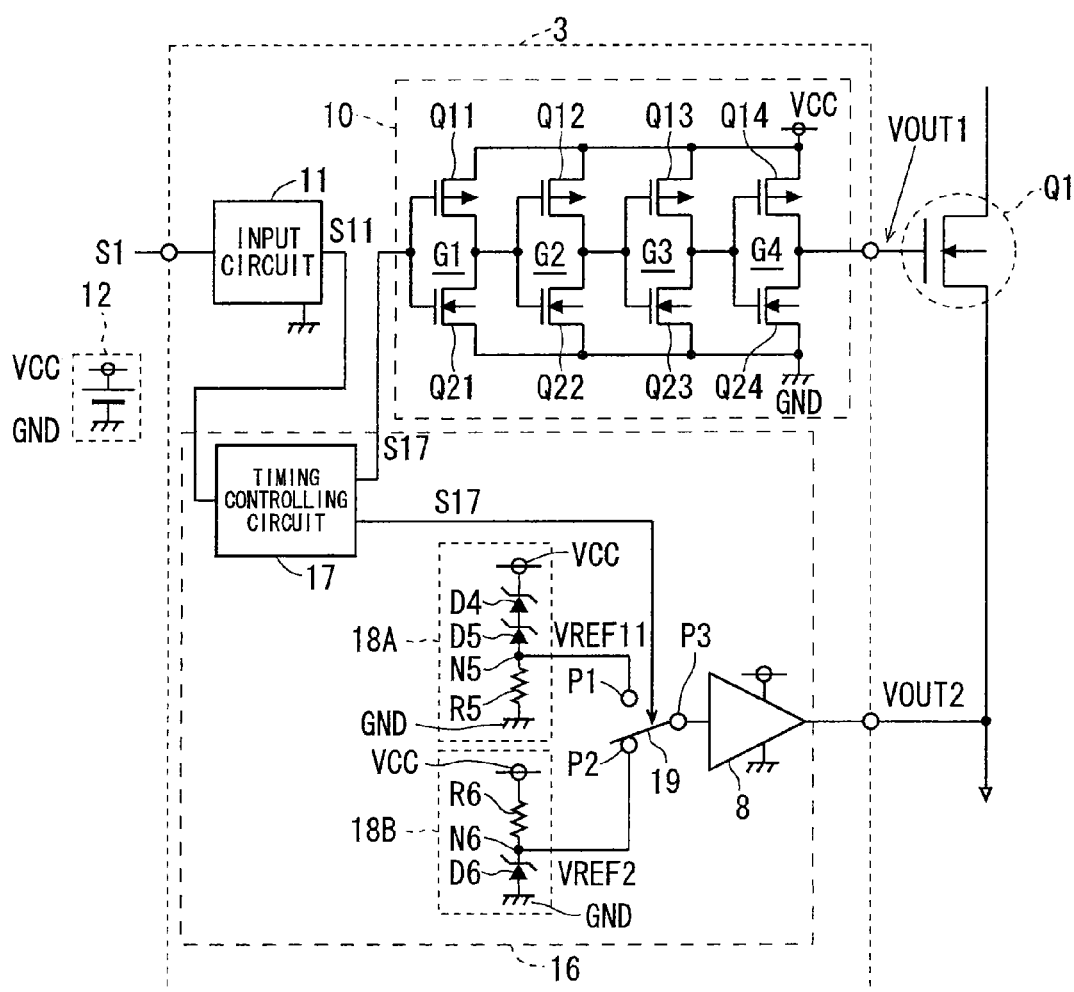

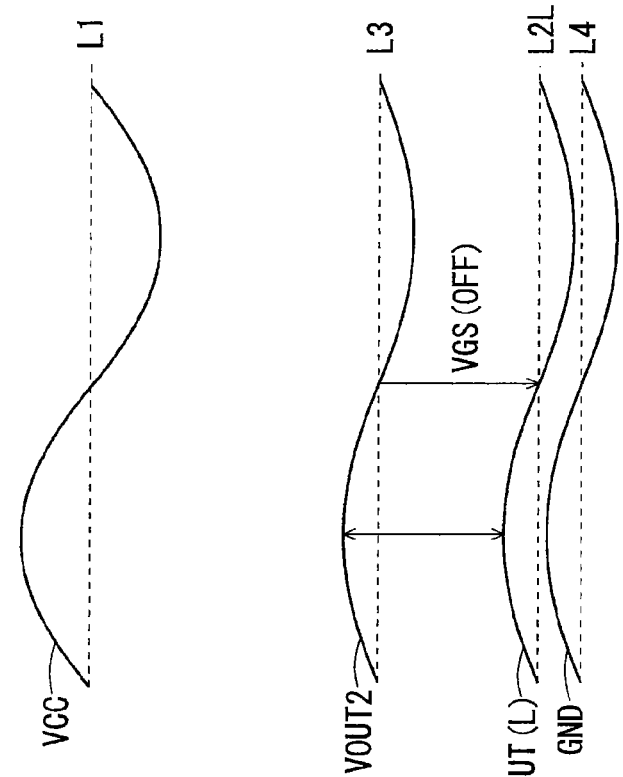
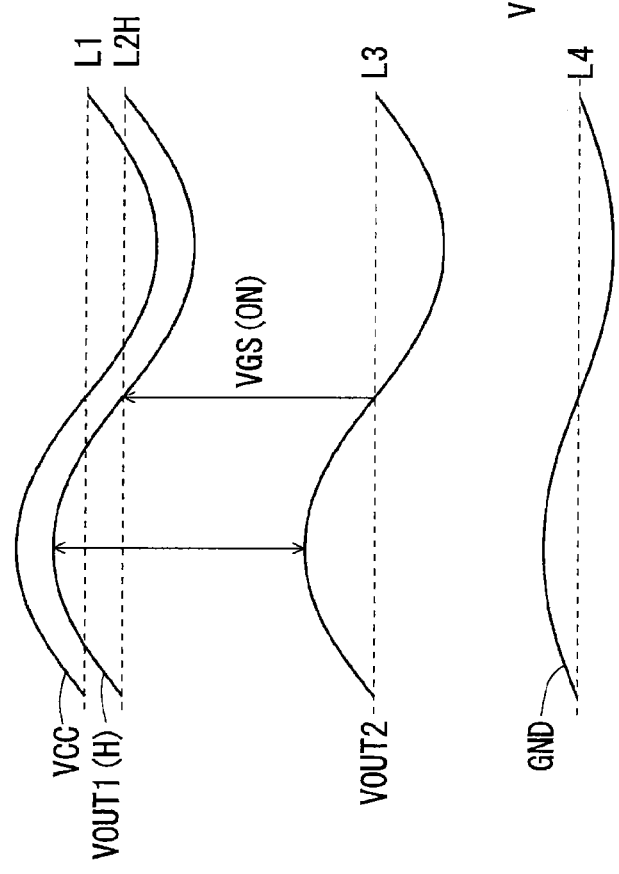

F I G . 7
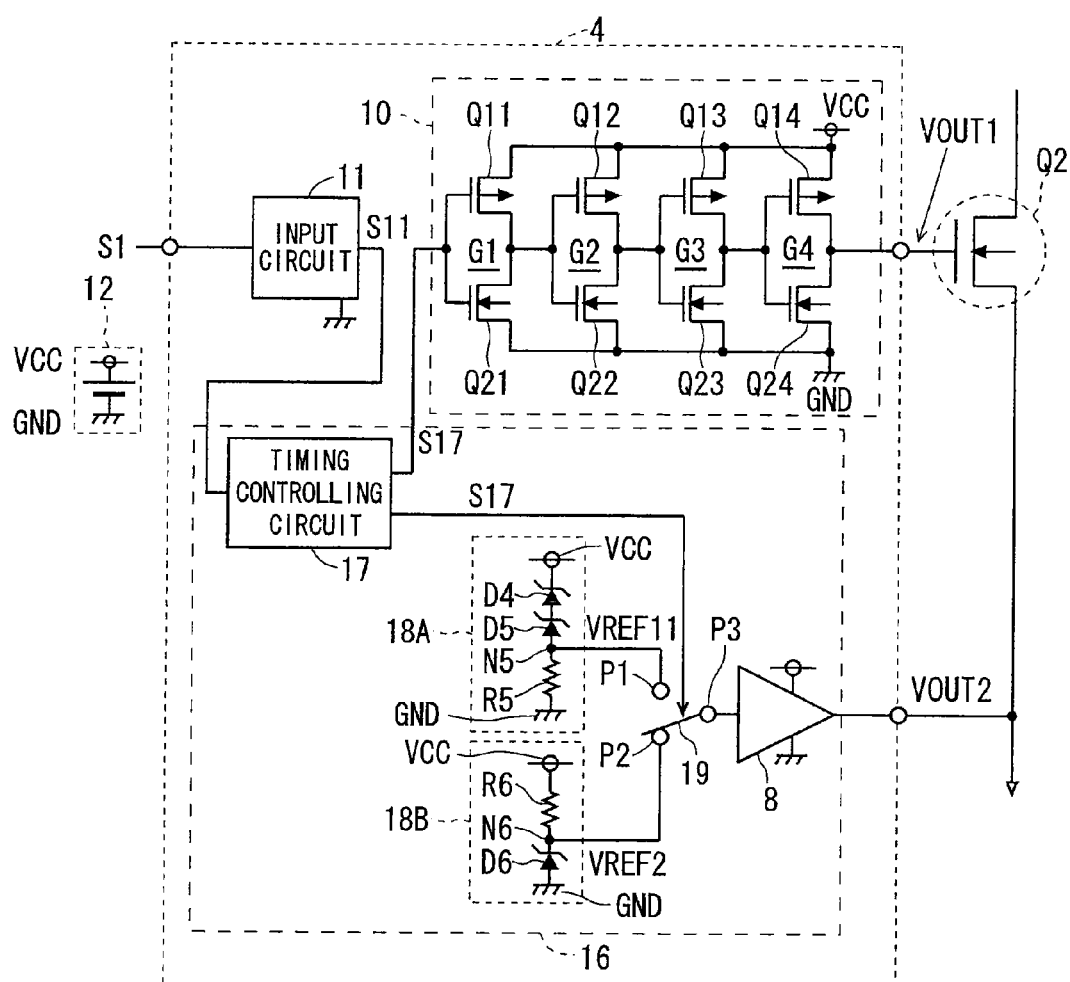

F I G . 1 0
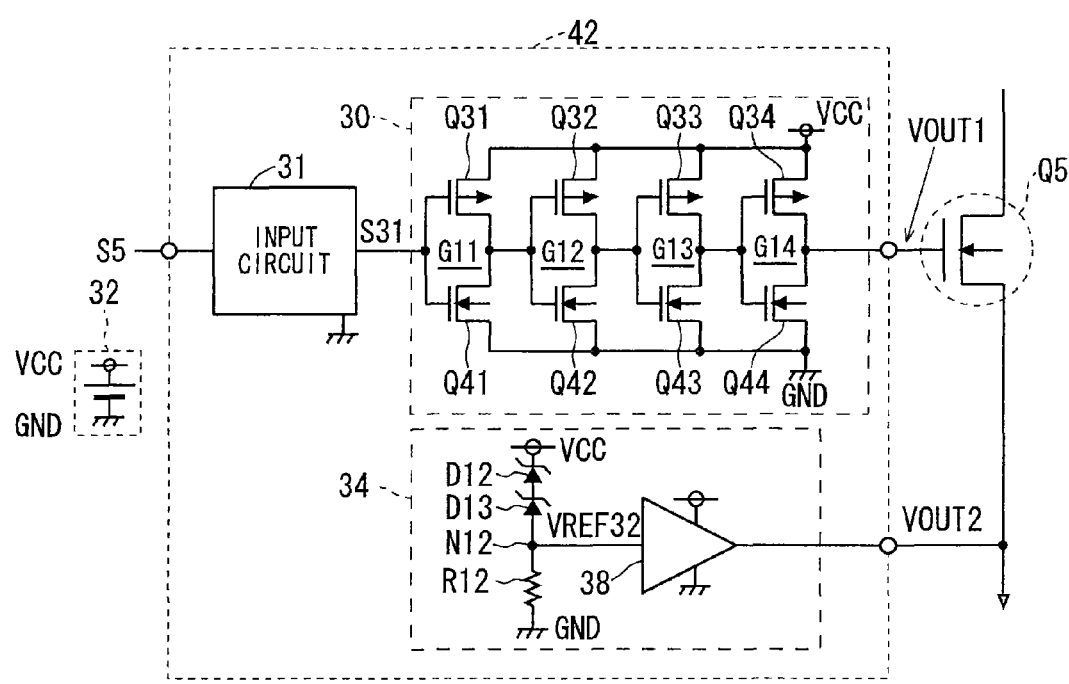

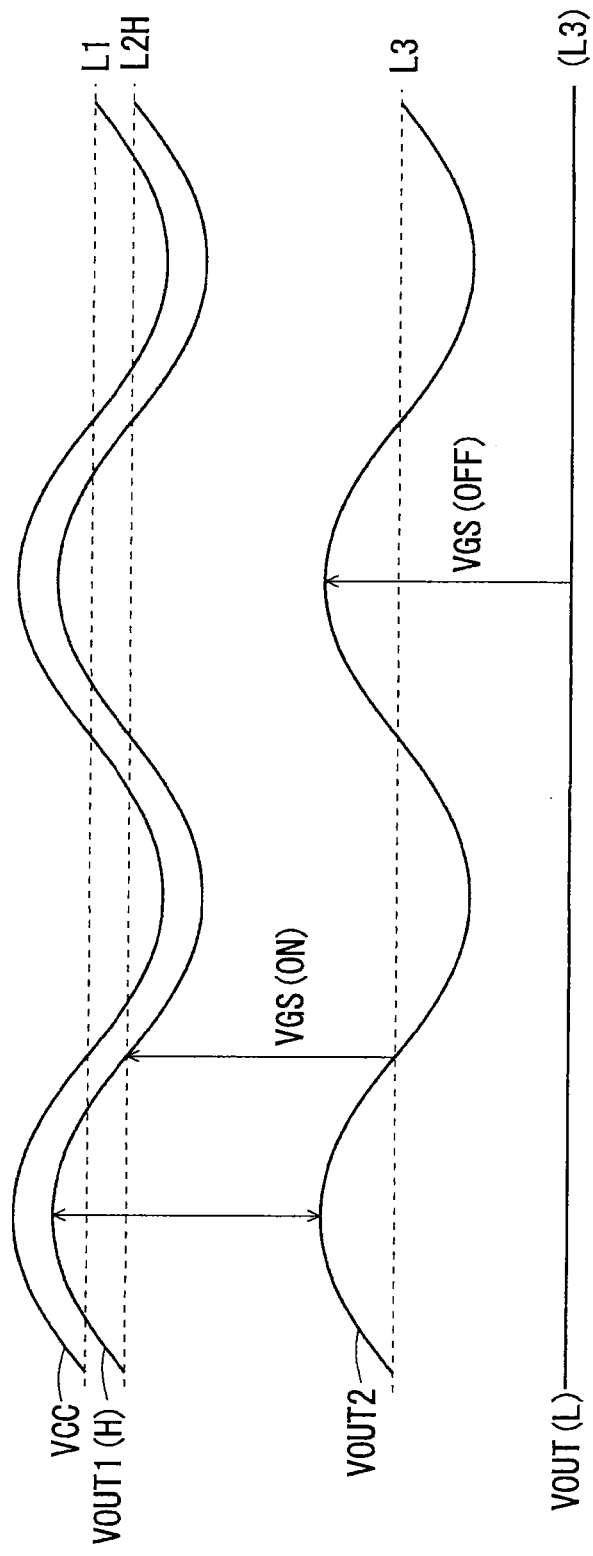

SEMICONDUCTOR ELEMENT DRIVING CIRCUIT AND SEMICONDUCTOR DEVICE

BACKGROUND OF THE INVENTION

1. Field of the Invention

The present invention relates to a semiconductor element driving circuit for controlling switching of a semiconductor element, and a semiconductor device with the semiconductor element and the semiconductor element driving circuit.

2. Description of the Background Art

A semiconductor element driving circuit disclosed for example as a driving control circuit of Japanese Patent Application Laid-Open No. 2010-226835, or as a semiconductor element control device of Japanese Patent Application Laid-Open No. 2009-44304, is capable of providing stable operation of a power semiconductor switching element as a semiconductor element even if a power supply voltage supplied to the semiconductor element fluctuates.

The reference voltage of the conventional semiconductor element driving circuit is generally set at a fixed value. The reference voltage is normally applied to the source electrode of a transistor.

It is assumed for example that the reference voltage is determined based on the ground, and that a semiconductor element to be driven requires a high gate-to-source voltage Vgs during the semiconductor element is ON. In this case, the fluctuation of a power supply voltage VCC makes the gate-to-source voltage Vgs applied to the semiconductor element fluctuate while the semiconductor element makes an ON operation, resulting in a problem of nonuniform current capability of the semiconductor element.

It is also assumed for example that the reference voltage is determined based on the power supply voltage VCC, and that a semiconductor element to be driven requires a relatively low threshold voltage Vth. In this case, the fluctuation of the power supply voltage VCC makes the gate-to-source voltage Vgs applied to the semiconductor element fluctuate while the semiconductor element makes an OFF operation, resulting in a problem of nonuniform turn-off loss of the semiconductor element.

SUMMARY OF THE INVENTION

It is an object of the present invention to obtain a semiconductor element driving circuit capable of stably driving the ON and OFF operations of a semiconductor element even if a power supply voltage fluctuates.

The semiconductor element driving circuit of a first aspect of the present invention drives a semiconductor element with a control electrode, one-side electrode, and the other-side electrode. The semiconductor element driving circuit operates by using first and second power supply voltages. The semiconductor element driving circuit includes a driving section and a reference power supply section.

The driving section makes the ON or OFF operation of the semiconductor element by outputting a driving signal at ON or OFF level to the control electrode of the semiconductor element. The driving section uses the first power supply voltage as a voltage for determining ON level, and the second power supply voltage as a voltage for determining OFF level.

The reference power supply section outputs a reference signal to the one-side electrode of the semiconductor element. The reference signal is determined by a reference voltage obtained by dividing a potential difference between the first and second power supply voltages by a predetermined dividing ratio.

In the semiconductor element driving circuit of the first aspect of the present invention, the fluctuation of the reference signal output from the reference power supply section can be made small by reflecting a predetermined dividing ratio in response to the fluctuations of the first and second power supply voltages. So, by suitably setting the predetermined dividing ratio, the fluctuation of a potential between the control electrode and the one-side electrode can be can be kept in an allowable range during the ON and OFF operations of the semiconductor element.

Thus, the first aspect of the present invention is capable of stably driving the ON and OFF operations of the semiconductor element.

The semiconductor element driving circuit of a second aspect of the present invention drives a semiconductor element with a control electrode, one-side electrode, and the other-side electrode. The semiconductor element driving circuit operates by using first and second power supply voltages. The semiconductor element driving circuit includes a driving section and a reference power supply section.

The driving section makes the ON or OFF operation of the semiconductor element by outputting a driving signal at ON or OFF level to the control electrode of the semiconductor element. The driving section uses a first internal power supply voltage as a voltage for determining ON level, and a second internal power supply voltage as a voltage for determining OFF level.

The reference power supply section outputs a reference signal to the one-side electrode of the semiconductor element. The reference signal is determined by a reference voltage as an intermediate potential between the first and second power supply voltages.

A voltage clamped at a level that is made different from the reference voltage by a first level to be closer to the first power supply voltage is specified as the first internal power supply voltage. A voltage clamped at a level that is made different from the reference signal by a second level to be closer to the second power supply voltage is specified as the second internal power supply voltage.

In the semiconductor element driving circuit of the second aspect of the present invention, the voltage clamped at a level that is made different from the reference voltage by the first level to be closer to the first power supply voltage is specified as the first internal power supply voltage. Further, the voltage clamped at a level that is made different from the reference signal by the second level to be closer to the second power supply voltage is specified as the second internal power supply voltage.

As a result, a potential difference between the reference signal and the driving signal at ON level, and a potential difference between the reference signal and the driving signal at OFF level, can always be kept at constant levels. Thus, the second aspect of the present invention does not generate the fluctuation of a potential between the control electrode and the one-side electrode of the semiconductor element during the ON and OFF operations of the semiconductor element even if the first and second power supply voltages fluctuate, thereby driving the semiconductor element stably.

The semiconductor element driving circuit of a third aspect of the present invention drives a semiconductor element with a control electrode, one-side electrode, and the other-side electrode. The semiconductor element driving circuit operates by using first and second power supply voltages. The semiconductor element driving circuit includes a driving section, first and second reference voltage output sections, and a reference signal output section.

The driving section makes the ON or OFF operation of the semiconductor element by outputting a driving signal at ON or OFF level to the control electrode of the semiconductor element. The driving section uses the first power supply voltage as a voltage for determining ON level, and the second power supply voltage as a voltage for determining OFF level.

The first reference voltage output section outputs a first reference voltage clamped at a level that is made different from the first power supply voltage by a first level to be closer to the second power supply voltage.

The second reference voltage output section outputs a second reference voltage clamped at a level that is made different from the second power supply voltage by a second level to be closer to the first power supply voltage.

The reference signal output section outputs a reference signal determined by the first reference voltage at a time when the driving signal is brought to ON level, and outputs the reference signal determined by the second reference voltage to the one-side electrode of the semiconductor element at a time when the driving signal is brought to OFF level.

In the semiconductor element driving circuit of the third aspect of the present invention, a reference signal determined by the first reference voltage is output at a time when the driving signal is brought to ON level, and the reference signal determined by the second reference voltage is output to the one-side electrode of the semiconductor element at a time when the driving signal is brought to OFF level. This makes the first reference voltage fluctuate in the same manner as the first power supply voltage, and makes the second reference voltage fluctuate in the same manner as the second power supply voltage.

As a result, a potential difference between the reference signal and the driving signal at ON level, and a potential difference between the reference signal and the driving signal at OFF level, can always be kept at constant levels. Thus, the third aspect of the present invention does not generate the fluctuation of a potential between the control electrode and the one-side electrode of the semiconductor element during the ON and OFF operations of the semiconductor element even if the first and second power supply voltages fluctuate, thereby driving the semiconductor element stably.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a circuit diagram showing the structure of a semiconductor element driving circuit of a third preferred embodiment of the present invention;

FIGS. 6A and 6B are waveform diagrams each showing operation control realized by the semiconductor element driving circuit of the third preferred embodiment shown in FIG. 5;

FIG. 7 is a circuit diagram showing the structure of a semiconductor element driving circuit of a fourth preferred embodiment of the present invention;

FIG. 10 is a circuit diagram showing the structure of a semiconductor element driving circuit of a second prerequisite technique; and FIG. 11 is a waveform diagram showing an ON operation realized by the second requisite technique explained in FIG. 10.

EMBODIMENT FOR CARRYING OUT THE INVENTION

<Prerequisite Technique>

Two prerequisite techniques are described below to facilitate understanding of the present invention.

(First Prerequisite Technique)

Figure 8:
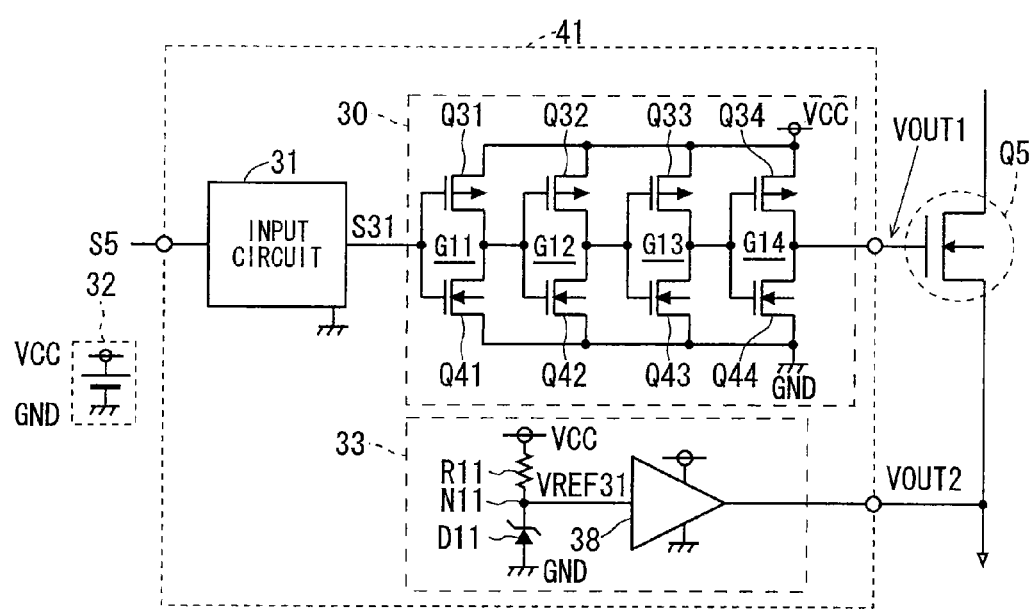
FIG. 8 is a circuit diagram showing the structure of a semiconductor element driving circuit of a first prerequisite technique.

FIG. 8 is a circuit diagram showing the structure of a semiconductor element driving circuit of a first prerequisite technique. As shown in FIG. 8, a semiconductor element driving circuit 41 is provided to a semiconductor element Q5 with a gate electrode (control electrode), a source electrode (one-side electrode), and a drain electrode (other-side electrode). The semiconductor element driving circuit 41 operates by using a power supply voltage VCC and a ground voltage GND as first and second power supplies given from a driving power supply section 32.

The semiconductor element driving circuit 41 includes a driving circuit 30, an input circuit 31, and a reference power supply section 33.

The input circuit 31 receives a control signal S5 from outside, and outputs a control signal S31 to the driving circuit 30 generated based on the control signal S5 and capable of operating the driving circuit 30.

The driving circuit 30 includes four-stage inverters G11 to G14 connected in series. The inverter G1$i$ ($i$ is any one of 1 to 4) includes a PMOS transistor Q3$i$ and an NMOS transistor Q4$i$. The source of the PMOS transistor Q3$i$ is connected to the power supply voltage VCC, and the drain of the PMOS transistor Q3$i$ is connected to the drain of the NMOS transistor Q4$i$. The source of the NMOS transistor Q4$i$ is connected to the ground voltage GND. The gates of the PMOS and NMOS transistors Q3$i$ and Q4$i$ function as an input part of the inverter G1$i$, and the drain of the PMOS transistor Q3$i$ (drain of the NMOS transistor Q4$i$) functions as an output part of the inverter G1$i$. An output voltage VOUT1 given from the output part of the inverter G14 is applied to the gate electrode of the semiconductor element Q5.

The reference power supply section 33 includes a resistor R11, a (Zener) diode D11, and a buffer circuit 38. One end of the resistor R11 is connected to the power supply voltage VCC, and the opposite end of the resistor R11 (node N11) is connected to the cathode of the diode D11. The anode of the diode D11 is connected to the ground voltage GND. So, a voltage clamped at a level that is made different from the ground voltage GND by the constant voltage (Zener voltage) of the diode D11 to be closer to the power supply voltage VCC is obtained as a reference voltage VREF31.

The buffer circuit 38 has an input part connected to the node N11 as the opposite end of the resistor R11. The buffer circuit 38 applies an output voltage VOUT2 determined by the reference voltage VREF31 to the source of the semiconductor element Q5.

Figure 9:
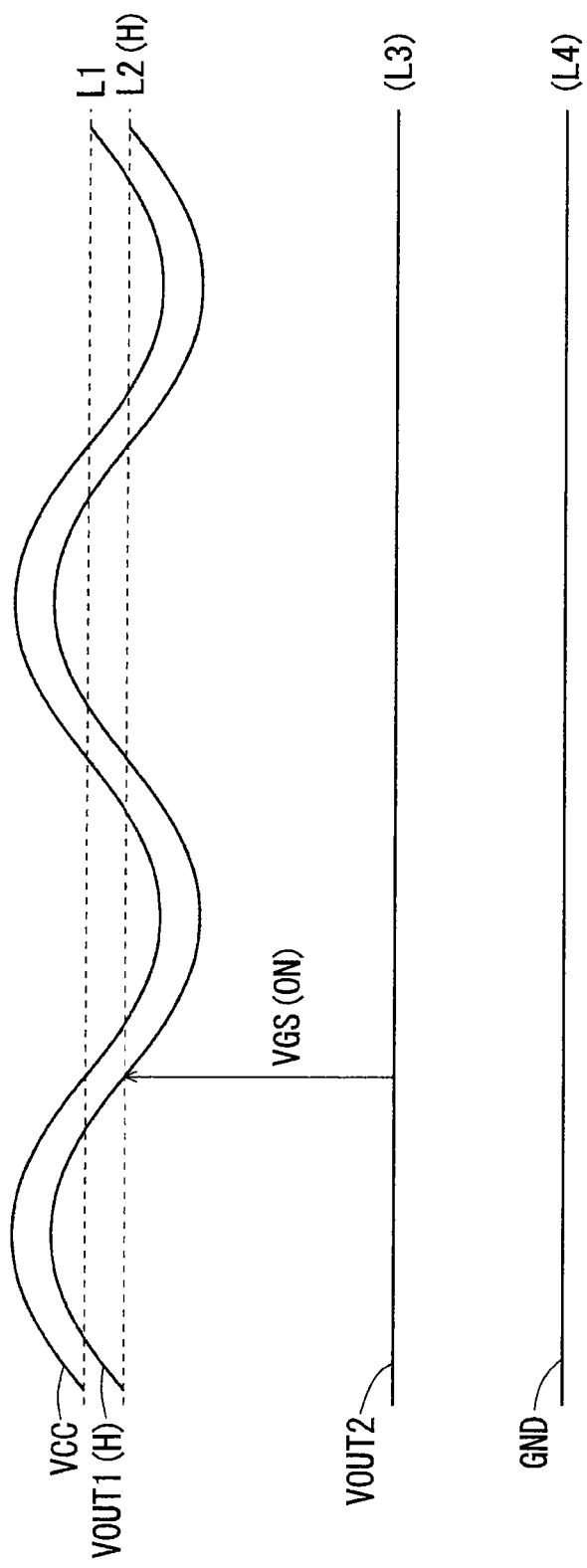
FIG. 9 is a waveform diagram showing an ON operation realized by the first requisite technique explained in FIG. 8.

FIG. 9 is a waveform diagram showing an ON operation realized by the first requisite technique explained in FIG. 8. As shown in FIG. 9, an output voltage VOUT1 (H) fluctuates in response to the fluctuation of the power supply voltage VCC. Voltage drop generated by a resistance in a channel portion of the PMOS transistor Q34 of the inverter G14 makes the output voltage VOUT1 (H) slightly lower in potential than the power supply voltage VCC.

The output voltage VOUT1 (H) means the fluctuation of the output voltage VOUT1 generated when the output voltage VOUT1 indicates "H" level (ON level). L1 means a level of an ideal power supply voltage with no fluctuation, and L2 (H) means an H level of an ideal driving voltage with no fluctuation.

The reference voltage VREF31 is a voltage clamped at a level that is made different from the ground voltage GND by the constant voltage (Zener voltage) of the diode D11 to be closer to the power supply voltage VCC. So, if the ground voltage GND is at an ideal ground level L4, the output voltage VOUT2 is also stably fixed at an ideal reference voltage level L3.

As seen from the above, in the first prerequisite technique, a gate-to-source voltage VGS (ON) during ON fluctuates in response to the fluctuation of the power supply voltage VCC while the semiconductor element Q5 makes an ON operation, resulting in a problem as the ON operation of the semiconductor element Q5 cannot be driven stably.

(Second Prerequisite Technique)

FIG. 10 is a circuit diagram showing the structure of a semiconductor element driving circuit of a second prerequisite technique. As shown in FIG. 10, a semiconductor element driving circuit 42 is provided to a semiconductor element Q5 having an NMOS transistor structure. The semiconductor element driving circuit 42 operates by using a power supply voltage VCC and a ground voltage GND as first and second power supplies given from a driving power supply section 32.

The semiconductor element driving circuit 42 includes a driving circuit 30, an input circuit 31, and a reference power supply section 34. The driving circuit 30 and the input circuit 31 are the same as the corresponding elements of the first requisite technique shown in FIG. 8. So, the driving circuit 30 and the input circuit 31 are identified by the same reference numerals, and will not be described below.

The reference power supply section 34 includes (Zener) diodes D12 and D13 connected in series, a resistor R12, and a buffer circuit 38. The cathode of the diode D12 is connected to the power supply voltage VCC. The anode of the diode D13 (node N12) is connected to one end of the resistor R12, and the opposite end of the resistor R12 is connected to the ground voltage GND. So, a voltage clamped at a level that is made different from the power supply voltage VCC by the two constant voltages of the diodes D12 and D13 to be closer to the ground voltage GND is obtained as a reference voltage VREF32.

The buffer circuit 38 has an input part connected to the node N12. The buffer circuit 38 applies an output voltage VOUT2 determined by the reference voltage VREF32 to the source of the semiconductor element Q5.

FIG. 11 is a waveform diagram showing an ON operation realized by the second requisite technique explained in FIG. 10. As shown in FIG. 11, output voltages VOUT1 (H) and VOUT2 fluctuate in response to the fluctuation of the power supply voltage VCC. So, a gate-to-source voltage VGS (ON) during ON can be kept at a constant level even if the power supply voltage VCC fluctuates.

Meanwhile, the reference voltage VREF32 is a voltage clamped at a level that is made different from the power supply voltage VCC by the two constant voltages of the diodes D12 and D13 to be closer to the ground voltage GND. So, if the ground voltage GND is at an ideal ground level L4 (not shown), an output voltage VOUT1 (L) is also stably fixed at an ideal reference voltage level L3.

As seen from the above, in the second prerequisite technique, a gate-to-source voltage VGS (OFF) during OFF fluctuates in response to the fluctuation of the power supply voltage VCC while the semiconductor element Q5 makes an OFF operation, resulting in a problem as the OFF operation of the semiconductor element Q5 cannot be driven stably.

Preferred embodiments described below realize a semiconductor element driving circuit capable of stably driving both the ON and OFF operations of a semiconductor element.

First Preferred Embodiment

Figure 1:
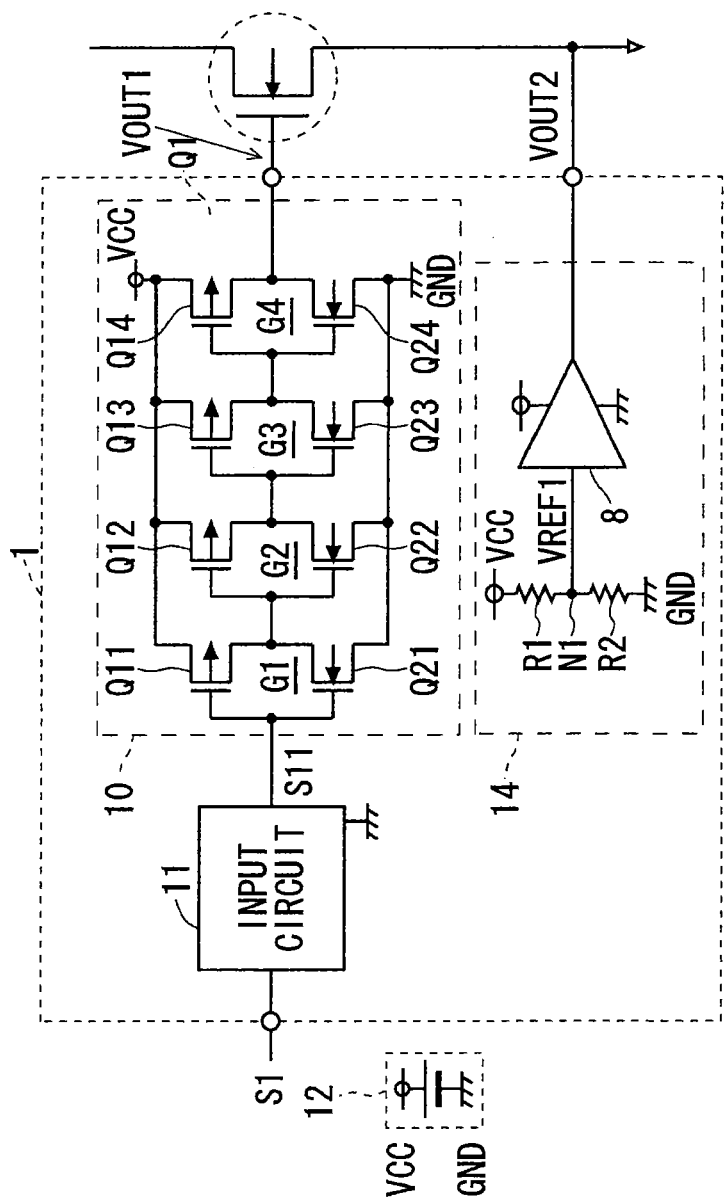
FIG. 1 is a circuit diagram showing the structure of a semiconductor element driving circuit of a first preferred embodiment of the present invention.

FIG. 1 is a circuit diagram showing the structure of a semiconductor element driving circuit of a first preferred embodiment of the present invention. As shown in FIG. 1, a semiconductor element driving circuit 1 is provided to a semiconductor element Q1 having an NMOS transistor structure with a gate electrode (control electrode), a source electrode (one-side electrode), and a drain electrode (other-side electrode). The semiconductor element driving circuit 1 operates by using a power supply voltage VCC and a ground voltage GND as first and second power supply voltages given from a driving power supply section 12.

The semiconductor element driving circuit 1 includes a driving circuit 10, an input circuit 11, and a reference power supply section 14.

The input circuit 11 receives a control signal S1 from outside, and outputs a control signal S11 to the driving circuit 10 generated based on the control signal S1 and capable of operating the driving circuit 10.

The driving circuit 10 includes four-stage inverters G1 to G4 connected in series. The inverter Gi (i is any one of 1 to 4) includes a PMOS transistor Q1$i$ and an NMOS transistor Q2$i$. The source of the PMOS transistor Q1$i$ is connected to the power supply voltage VCC, and the drain of the PMOS transistor Q1$i$ is connected to the drain of the NMOS transistor Q2$i$. The source of the NMOS transistor Q2$i$ is connected to the ground voltage GND. The gates of the PMOS and NMOS transistors Q1$i$ and Q2$i$ function as an input part of the inverter Gi, and the drain of the PMOS transistor Q1$i$ (drain of the NMOS transistor Q2$i$) functions as an output part of the inverter Gi. An output voltage VOUT1 given from the output part of the inverter G4 is applied to the gate electrode of the semiconductor element Q1.

So, based on the control signal S11 given from the input circuit 11, the driving circuit 10 outputs the output voltage VOUT1 as a driving signal given from the inverter G4. The output voltage VOUT1 is at H (ON level) if it is determined by the power supply voltage VCC, and is at L (OFF level) if it is determined by the ground voltage GND.

The reference power supply section 14 includes resistors R1 and R2, and a buffer circuit 8. One end of the resistor R1 is connected to the power supply voltage VCC, and the opposite end of the resistor R1 (node N1) is connected to one end of the resistor R2. The opposite end of the resistor R2 is connected to the ground voltage GND. As a result of this series connection of the resistors R1 and R2, a voltage determined by dividing a potential difference between the power supply voltage VCC and the ground voltage GND by a predetermined dividing ratio (resistance ratio between the resistors R1 and R2) is obtained as a reference voltage VREF1.

The buffer circuit 8 has an input part connected to the node N1. The buffer circuit 8 applies an output voltage VOUT2 (VOUT2=VREF1, for example) as a reference signal determined by the reference voltage VREF1 to the source of the semiconductor element Q1.

Figure 2:
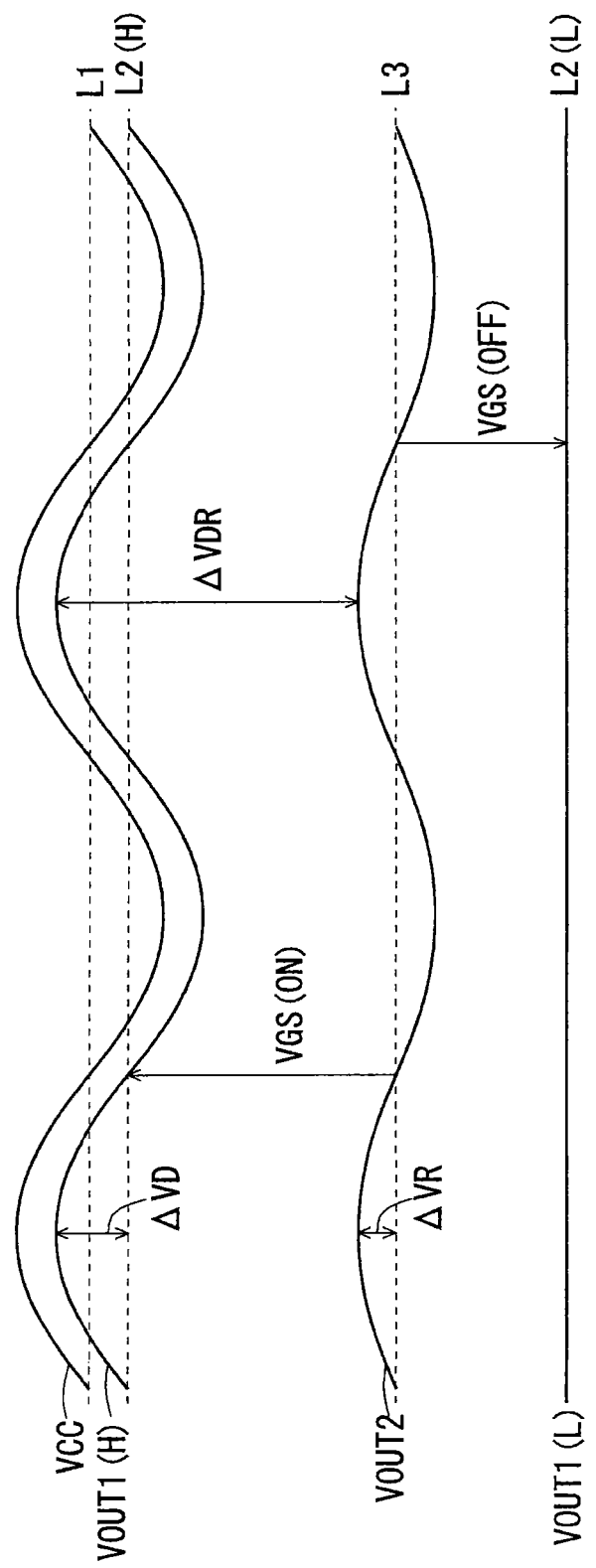
FIG. 2 is a waveform diagram showing operation control realized by the semiconductor element driving circuit of the first preferred embodiment shown in FIG. 1.

FIG. 2 is a waveform diagram showing operation control realized by the semiconductor element driving circuit 1 of the first preferred embodiment shown in FIG. 1. In FIG. 2, an output voltage VOUT1 (H) shows the change of the output voltage VOUT1 when the output voltage VOUT1 indicates "H." An output voltage VOUT1 (L) shows the change of the output voltage VOUT1 when the output voltage VOUT1 indicates "L." Further, L1 means a level of an ideal power supply voltage with no fluctuation, and L2 (H) means an H level of an ideal driving voltage with no fluctuation. Also, L2 (L) means a L level of an ideal driving voltage with no fluctuation, and L3 means a level of an ideal reference voltage with no fluctuation.

As shown in FIG. 2, the output voltage VOUT1 (H) fluctuates in response to the fluctuation of the power supply voltage VCC. Voltage drop generated by a resistance in a channel portion of the PMOS transistor Q14 of the inverter G4 makes the output voltage VOUT1 (H) slightly lower in potential than the power supply voltage VCC.

In FIG. 2, the output voltage VOUT1 (H) changes from the H level L2 (H) of an ideal driving voltage by the amount of driving voltage fluctuation $\Delta VD$.

The reference voltage VREF1 is obtained by dividing a potential difference between the power supply voltage VCC and the ground voltage GND by a dividing ratio determined based on a resistance ratio between the resistors R1 and R2. It is assumed for example that the power supply voltage VCC is 22 V and the ground voltage GND is 0 V, and the dividing ratio is set at 7/22 in order to obtain the reference voltage VREF1 of 7 V. In this case, the amount of reference voltage fluctuation $\Delta VR$ by which the output voltage VOUT2 changes from the ideal reference voltage level L3 can be reduced to 7/22 the amount of driving voltage fluctuation $\Delta VD$.

A gate-to-source voltage VGS (ON) during ON fluctuates in response to the fluctuation of the power supply voltage VCC while the semiconductor element Q1 is ON. The first preferred embodiment allows the amount of fluctuation of the gate-to-source voltage VGS to be smaller than the amount of driving voltage fluctuation $\Delta VD$ by the amount of reference voltage fluctuation $\Delta VR$ ($\Delta VD-\Delta VR$).

If the power supply voltage VCC changes to be higher or lower than 22 V by 2 V, for example, the amount of driving voltage fluctuation $\Delta VD$ becomes ±2 V. In this case, the amount of fluctuation ($\Delta VD-\Delta VR$), calculated as (1−7/22)×(±2), can be reduced to ±1.36 V.

Meanwhile, in the first preferred embodiment, even if the ground voltage GND is at an ideal ground level L4 (not shown), the output voltage VOUT2 fluctuates by the amount of reference voltage fluctuation $\Delta VR$ as long as the power supply voltage VCC fluctuates.

This amount of reference voltage fluctuation $\Delta VR$ is smaller than the amount of driving voltage fluctuation $\Delta VD$. As an example, the amount of driving voltage fluctuation $\Delta VD$ becomes ±2 V if the ground voltage GND changes to be higher or lower than 0 V by 2 V. In this case, the amount of reference voltage fluctuation $\Delta VR$, calculated as (7/22)×(±2), can be reduced to ±0.64 V.

As a result, the semiconductor element driving circuit 1 of the first preferred embodiment is capable of stably driving the ON and OFF operations of the semiconductor element Q1 by making the reference power supply section 14 suitably set a dividing ratio in consideration of the fluctuations of the power supply voltage VCC and the ground voltage GND.

As described above, the output voltage VOUT2 (reference signal) output from the reference power supply section 14 of the semiconductor element driving circuit 1 of the first preferred embodiment can be made small by reflecting a dividing ratio that is determined based on a resistance ratio between the resistors R1 and R2 in response to the fluctuations of the power supply voltage VCC and the ground voltage GND. Thus, the fluctuation of a potential between the control electrode and the one-side electrode during the ON and OFF operations of a semiconductor element can be kept in an allowable range.

As a result, the semiconductor element driving circuit 1 of the first preferred embodiment is capable of driving the ON and OFF operations of the semiconductor element Q1 stably.

Stabilized capability of the semiconductor element Q1 to supply current makes it possible to operate the semiconductor element Q1 while achieving high energy efficiency, so that energy saving can be realized.

Stabilized capability of the semiconductor element Q1 to supply current is expected to enhance yield, so that a manufacturing process can be enhanced.

If a semiconductor device includes the semiconductor element Q1 and the semiconductor element driving circuit 1 of the first preferred embodiment, the semiconductor element Q1 is capable of stably making its ON and OFF operations in the semiconductor device.

Second Preferred Embodiment

Figure 3:
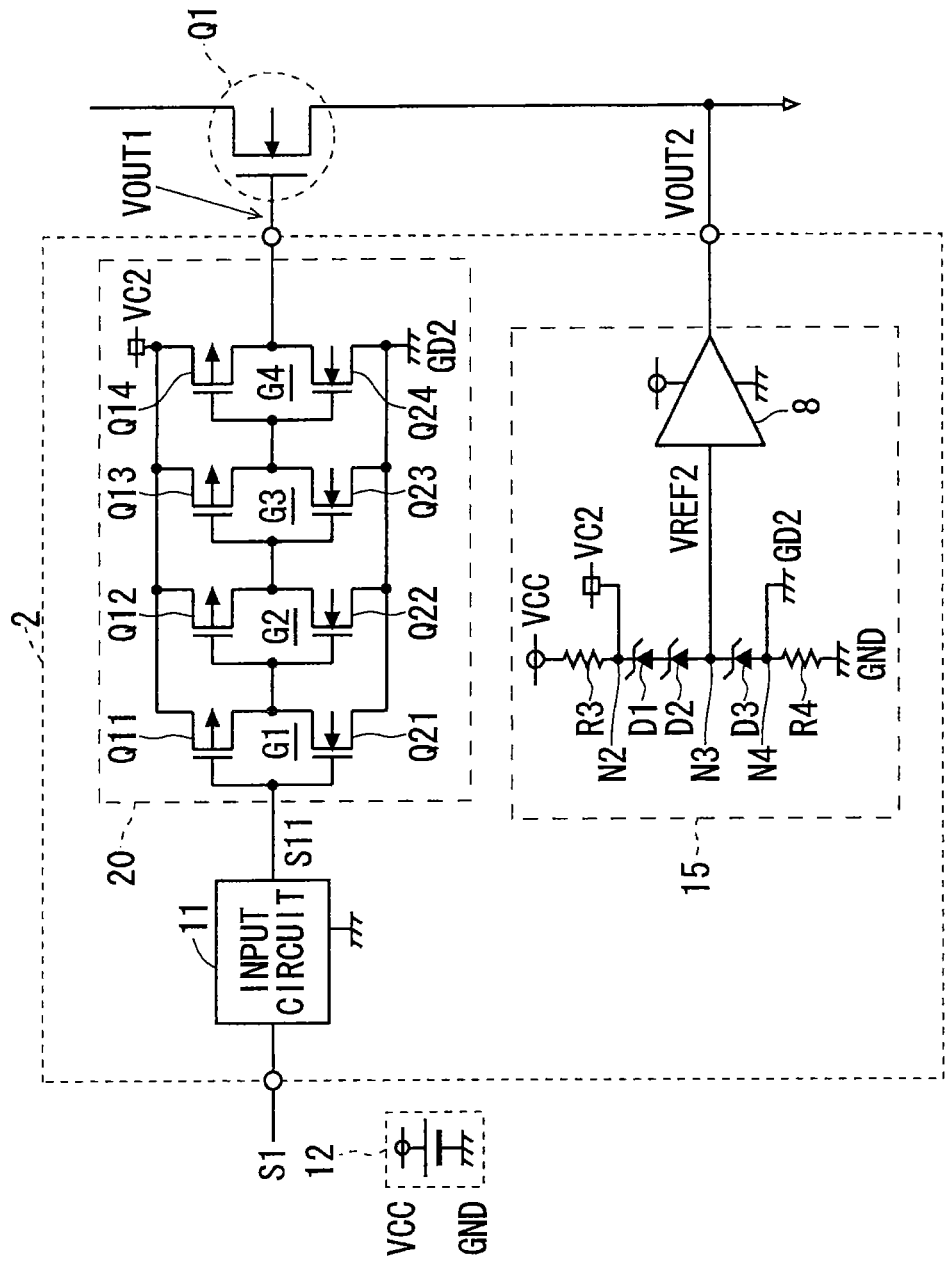
FIG. 3 is a circuit diagram showing the structure of a semiconductor element driving circuit of a second preferred embodiment of the present invention.

FIG. 3 is a circuit diagram showing the structure of a semiconductor element driving circuit of a second preferred embodiment of the present invention. As shown in FIG. 3, a semiconductor element driving circuit 2 is provided to a semiconductor element Q1 having an NMOS transistor structure. The semiconductor element driving circuit 2 operates by using a power supply voltage VCC and a ground voltage GND as first and second power supplies given from a driving power supply section 12.

The semiconductor element driving circuit 2 includes a driving circuit 20, an input circuit 11, and a reference power supply section 15. The input circuit 11 is the same as the corresponding element of the first preferred embodiment shown in FIG. 1. So, the input circuit 11 is identified by the same reference numeral, and will not be described below.

Like the driving circuit 10 of the first preferred embodiment, the driving circuit 20 includes four-stage inverters G1 to G4 connected in series. The inverter Gi (i is any one of 1 to 4) includes a PMOS transistor Q1$i$ and an NMOS transistor Q2$i$. The source of the PMOS transistor Q1$i$ is connected to an internal power supply voltage VC2, and the drain of the PMOS transistor Q1$i$ is connected to the drain of the NMOS transistor Q2$i$. The source of the NMOS transistor Q2$i$ is connected to an internal ground voltage GD2. The gates of the PMOS and NMOS transistors Q1$i$ and Q2$i$ function as an input part of the inverter Gi, and the drain of the PMOS transistor Q1$i$ (drain of the NMOS transistor Q2$i$) functions as an output part of the inverter Gi. An output voltage VOUT1 given from the output part of the inverter G4 is applied to the gate electrode of the semiconductor element Q1.

The reference power supply section 15 includes a resistor R3, three (Zener) diodes D1 to D3 connected in series, a resistor R4, and a buffer circuit 8. One end of the resistor R3 is connected to the power supply voltage VCC, and the opposite end of the resistor R3 (node N2) is connected to the cathode of the diode D1. The anode of the diode D3 (node N4) is connected to one end of the resistor R4, and the opposite end of the resistor R4 is connected to the ground voltage GND.

A reference voltage VREF2 is obtained from an node N3 corresponding to the anode of the diode D2 (cathode of the diode D3). To be specific, the reference voltage VREF2 is determined as an intermediate potential between the power supply voltage VCC and the ground voltage GND.

The internal power supply voltage VC2 is obtained from the node N2 corresponding to the cathode of the diode D1, and the internal ground voltage GD2 is obtained from the node N4 corresponding to the anode of the diode D3.

So, the internal power supply voltage VC2 is a voltage clamped at a level that is made different from the reference voltage VREF2 by the constant voltages of the two diodes D1 and D2 to be closer to the power supply voltage VCC. Likewise, the internal ground voltage GD2 is a voltage clamped at a level that is made different from the reference voltage VREF2 by the constant voltage of one diode D3 to be closer to the ground voltage GND.

So, a potential difference between the internal power supply voltage VC2 and the reference voltage VREF2, and a potential difference between the internal ground voltage GD2 and the reference voltage VREF2, can be kept at constant levels even if the power supply voltage VCC and the ground voltage GND fluctuate.

To be specific, the internal power supply voltage VC2 is at a constant level even if the power supply voltage VCC fluctuates, and the internal ground voltage GD2 is at a constant level even if the ground voltage GND fluctuates.

It is assumed for example that the power supply voltage VCC is about 25 V, a voltage between the internal power supply voltage VC2 and the reference voltage VREF2 is 14 V, and a voltage between the reference voltage VREF2 and the internal ground voltage GD2 is G7 V. In this case, the aforementioned voltages of 14 V and 7 V can be maintained even if a voltage between the power supply voltage VCC and the ground voltage GND is made higher or lower than 25 V by 2 V.

The buffer circuit 8 has an input part connected to the node N3. The buffer circuit 8 applies an output voltage VOUT2 (VOUT2=VREF2, for example) determined by the reference voltage VREF2 to the source of the semiconductor element Q1.

Figure 4:
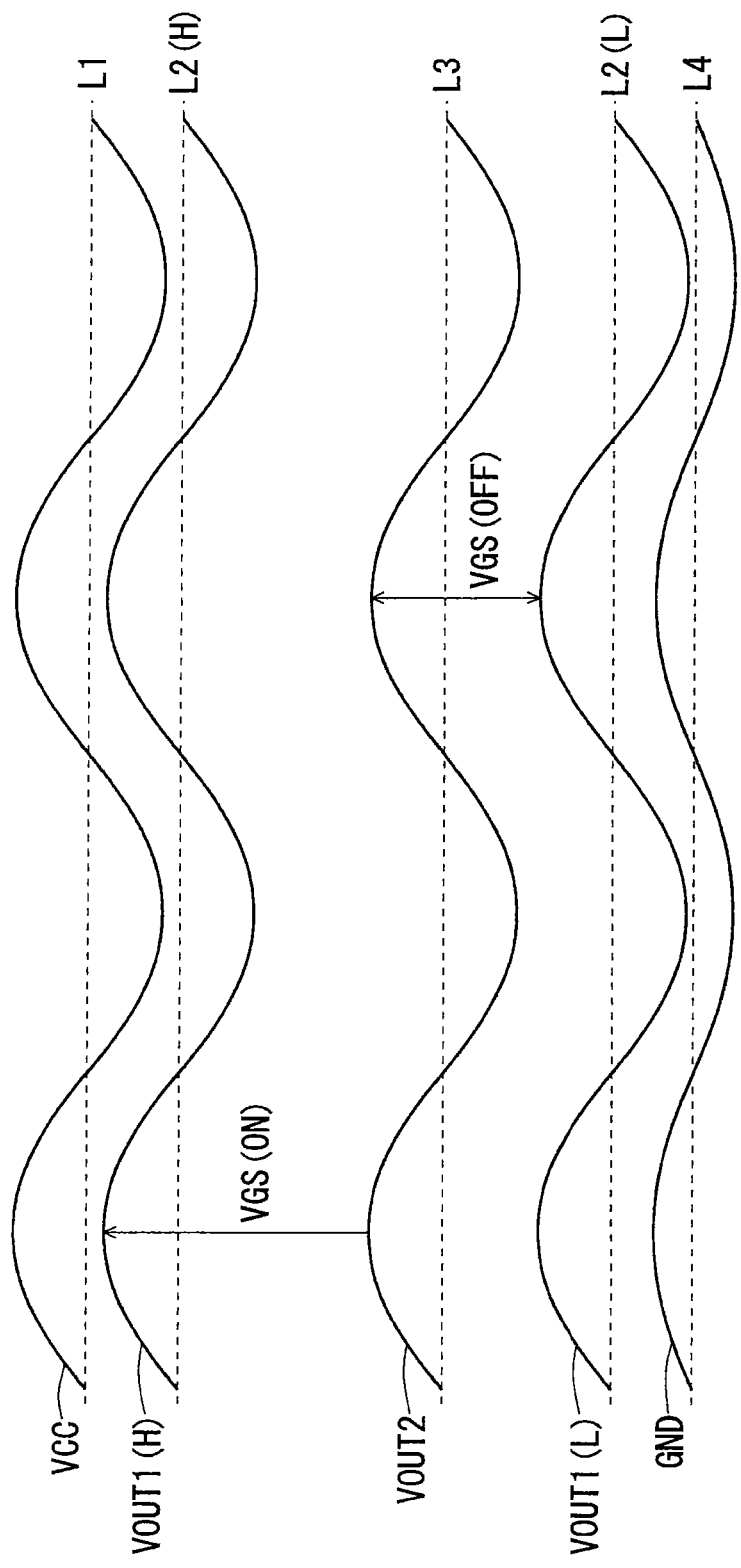
FIG. 4 is a waveform diagram showing operation control realized by the semiconductor element driving circuit of the second preferred embodiment shown in FIG. 3.

FIG. 4 is a waveform diagram showing operation control realized by the semiconductor element driving circuit 2 of the second preferred embodiment shown in FIG. 3. In FIG. 4, L4 shows an ideal ground level with no fluctuation.

As shown in FIG. 4, output voltages VOUT1 (H) and VOUT2 both fluctuate by following the same waveform even if the power supply voltage VCC fluctuates. So, a potential difference between the output voltages VOUT1 (H) and VOUT2 is not affected by the fluctuation of the power supply voltage VCC, as the output voltage VOUT1 (H) is determined by the internal power supply voltage VC2 clamped at a level that is made different from the reference voltage VREF2 to be closer to the power supply voltage VCC.

As a result, the semiconductor element driving circuit 2 of the second preferred embodiment is capable of keeping a gate-to-source voltage VGS (ON) during ON at a constant level even if the power supply voltage VCC fluctuates. Thus, the ON operation of the semiconductor element Q1 can be driven stably.

Further, output voltages VOUT1 (L) and VOUT2 fluctuate within the same waveform. So, a potential difference between the output voltages VOUT1 (L) and VOUT2 is not affected by the fluctuation of the power supply voltage VCC, as the output voltage VOUT1 (L) is determined by the internal ground voltage GD2 clamped at a level that is made different from the reference voltage VREF2 to be closer to the ground voltage GND.

As a result, the semiconductor element driving circuit 2 of the second preferred embodiment is capable of keeping the gate-to-source voltage VGS (OFF) during OFF at a constant level even if the ground voltage GND fluctuates. Thus, the OFF operation of the semiconductor element Q1 can be driven stably.

As described above, the semiconductor element driving circuit 2 of the second preferred embodiment specifies a voltage clamped at a level made different from the reference voltage VREF2 output from the reference power supply section 15 by a first level (constant voltages of the two diodes D1 and D2) to be closer to the power supply voltage VCC as the internal power supply voltage VC2 (first internal power supply voltage). The semiconductor element driving circuit 2 of the second preferred embodiment also specifies a voltage clamped at a level made different from the reference voltage VREF2 by a second level (constant voltage of one diode D3) to be closer to the ground voltage GND as the internal ground voltage GD2 (second internal power supply voltage).

As a result, a potential difference between a reference signal (output voltage VOUT2) and a driving signal (output voltage VOUT1 (H)) at "H" (ON level), and a potential difference between the reference signal and a driving signal (output voltage VOUT1 (L)) at "L" (OFF level), can always be kept at constant levels. So, even if the power supply voltage VCC and the ground voltage GND fluctuate, the gate-to-source voltage VGS will not fluctuate during the ON and OFF operations of the semiconductor element Q1. Thus, the semiconductor element Q1 can be driven stably. If a semiconductor device includes the semiconductor element Q1 and the semiconductor element driving circuit 2 of the second preferred embodiment, the semiconductor element Q1 is capable of stably making its ON and OFF operations in the semiconductor device.

Third Preferred Embodiment

FIG. 5 is a circuit diagram showing the structure of a semiconductor element driving circuit of a third preferred embodiment of the present invention. As shown in FIG. 5, a semiconductor element driving circuit 3 is provided to a semiconductor element Q1 having an NMOS transistor structure. The semiconductor element driving circuit 3 operates by using a power supply voltage VCC and a ground voltage GND as first and second power supplies given from a driving power supply section 12.

The semiconductor element driving circuit 3 includes a driving circuit 10, an input circuit 11, and a reference power supply section 16. The driving circuit 10 and the input circuit 11 are the same as the corresponding elements of the first preferred embodiment shown in FIG. 1, except for a timing controlling circuit 17 described later interposed between the driving circuit 10 and the input circuit 11. So, the driving circuit 10 and the input circuit 11 are identified by the same reference numerals, and the common parts thereof will not be described below.

The reference power supply section 16 includes the timing controlling circuit 17, a reference power supply 18A (first reference voltage output section), a reference power supply 18B (second reference voltage output section), a switch 19, and a buffer circuit 8.

The timing controlling circuit 17 receives a control signal S1, and outputs a control signal S17 to an input part of the inverter G1 of the driving circuit 10 and to the switch 19.

The reference power supply 18A includes two (Zener) diodes D4 and D5 connected in series, and a resistor R5. The cathode of the diode D4 is connected to the power supply voltage VCC, and the anode of the diode D5 (node N5) is connected to one end of the resistor R5. The opposite end of the resistor R5 is connected to the ground voltage GND.

A reference voltage VREF11 obtained from the node N5 is a voltage clamped at a level that is made different from the power supply voltage VCC by the constant voltages of the two diodes D4 and D5 to be closer to the ground voltage GND. The reference voltage VREF11 is applied to a terminal P1.

The reference power supply 18B includes a resistor R6 and a (Zener) diode D6. One end of the resistor R6 is connected to the power supply voltage VCC, and the opposite end of the resistor R6 (node N6) is connected to the cathode of the diode D6. The anode of the diode D6 is connected to the ground voltage GND.

A reference voltage VREF12 obtained from the node N6 is a voltage clamped at a level that is made different from the ground voltage GND by the constant voltage of one diode D6 to be closer to the power supply voltage VCC. The reference voltage VREF12 is applied to a terminal P2.

The switch 19 receives the control signal S17. The switch 19 connects the terminals P1 and P3 if the control signal S17 indicates "H," and connects the terminals P2 and P3 if the control signal S17 indicates "L."

To be specific, the switch 19 applies the reference voltage VREF11 to the terminal P3 at a time when an output voltage VOUT1 (H) is output as the output voltage VOUT1. Further, the switch 19 applies the reference voltage VREF12 to the terminal P3 at a time when an output voltage VOUT1 (L) is output as the output voltage VOUT1.

The buffer circuit 8 applies an output voltage VOUT2 determined by a voltage obtained from the terminal P3 to the source electrode of the semiconductor element Q1. To be specific, the buffer circuit 8 outputs the output voltage VOUT2 (VOUT2=VREF11, for example) determined by the reference voltage VREF11 at a time when the output voltage VOUT1 (H) is output as the output voltage VOUT1. Further, the buffer circuit 8 outputs the output voltage VOUT2 (VOUT2=VREF12, for example) determined by the reference voltage VREF12 at a time when the output voltage VOUT1 (L) is output as the output voltage VOUT1.

FIGS. 6A and 6B are waveform diagrams each showing operation control realized by the semiconductor element driving circuit 3 of the third preferred embodiment shown in FIG. 5. As shown in FIG. 6A, in response to the fluctuation of the power supply voltage VCC, the output voltages VOUT1 (H) and VOUT2 both change in the same manner as the power supply voltage VCC. Thus, a gate-to-source voltage VGS (ON) during ON is always kept at a constant level.

If the power supply voltage VCC is 22 V, for example, the reference voltage VREF11, clamped at a level made different from the power supply voltage VCC by the constant voltages of the two diodes D4 and D5 to be closer to the ground voltage GND (7 V for each of the diodes D4 and D5), becomes 8 V. If the power supply voltage VCC fluctuates by ±2 V in this case, not only the output voltage VOUT1 (H) but also the output voltage VOUT2 fluctuates by ±2V.

Thus, the semiconductor element driving circuit 3 of the third preferred embodiment is capable of keeping the gate-to-source voltage VGS (ON) during ON at a constant level even if the power supply voltage VCC fluctuates, thereby driving the ON operation of the semiconductor element Q1 stably.

Also, as shown in FIG. 6B, in response to the fluctuation of the ground voltage GND, output voltages VOUT1 (L) and VOUT2 both change in the same manner as the ground voltage GND. Thus, the gate-to-source voltage VGS (OFF) during OFF is always kept at a constant level.

If the ground voltage GND is 0 V, for example, the reference voltage VREF12 clamped at a level determined by the constant voltage of the diode D6 (7 V) becomes 7 V. If the ground voltage GND fluctuates by ±2 V in this case, not only the output voltage VOUT1 (L) but also the output voltage VOUT2 fluctuates by ±2V.

Thus, the semiconductor element driving circuit 3 of the third preferred embodiment is capable of keeping the gate-to-source voltage VGS (OFF) during OFF at a constant level even if the ground voltage GND fluctuates, thereby driving the OFF operation of the semiconductor element Q1 stably.

The semiconductor element driving circuit 3 of the third preferred embodiment includes a reference signal output section including the input circuit 11, the timing controlling circuit 17, and the switch 19. As described above, the reference signal output section outputs the output voltage VOUT2 determined by the reference voltage VREF11 at a time when the output voltage VOUT1 is brought to "H," and outputs the output voltage VOUT2 determined by the reference voltage VREF12 at a time when the output voltage VOUT1 is brought to "L." This makes the reference voltage VREF1 fluctuate in the same manner as the power supply voltage VCC, while making the reference voltage VREF12 fluctuate in the same manner as the ground voltage GND.

As a result, a potential difference between the output voltages VOUT2 and VOUT1 (H), and a potential difference between the output voltages VOUT2 and VOUT1 (L), can always be kept at constant levels. So, even if the power supply voltage VCC and the ground voltage GND fluctuate, the gate-to-source voltage VGS will not fluctuate during the ON and OFF operations of the semiconductor element Q1. Thus, the semiconductor element Q1 can be driven stably.

If a semiconductor device includes the semiconductor element Q1 and the semiconductor element driving circuit 3 of the third preferred embodiment, the semiconductor element Q1 is capable of stably making its ON and OFF operations in the semiconductor device.

Fourth Preferred Embodiment

FIG. 7 is a circuit diagram showing the structure of a semiconductor element driving circuit of a fourth preferred embodiment of the present invention. As shown in FIG. 7, a semiconductor element driving circuit 4 is provided to an SiC semiconductor element Q2 having an NMOS transistor structure. The SiC semiconductor element Q2 is formed by using silicon carbide.

The internal structure of the semiconductor element driving circuit 4 is the same as that of the semiconductor element driving circuit 3 of the third preferred embodiment shown in FIG. 5, except for that the SiC semiconductor element Q2 takes the place of the semiconductor element Q1. So, the internal structure of the semiconductor element driving circuit 4 is identified by the same reference numerals, and will not be described below.

Like the semiconductor element driving circuit 3 of the third preferred embodiment, the semiconductor element driving circuit 4 of the fourth preferred embodiment is capable of stably driving both the ON and OFF operations of the SiC semiconductor element Q2.

If a semiconductor device includes the SiC semiconductor element Q2 and the semiconductor element driving circuit 4 of the fourth preferred embodiment, the SiC semiconductor element Q2 is capable of stably making its ON and OFF operations in the semiconductor device.

The semiconductor element driving circuit 4 of the fourth preferred embodiment has the same internal structure same as that of the semiconductor element driving circuit 3 of the third preferred embodiment. Meanwhile, the semiconductor element driving circuit 4 may also have the same internal structure same as that of the semiconductor element driving circuit 1 or 2 of the first or second preferred embodiment.

<Others>

Semiconductor elements used in the preferred embodiments described above are the (N-type) semiconductor elements Q1 and Q2 of an NMOS transistor structure.

Meanwhile, (P-type) semiconductor elements of a PMOS transistor structure may take the place of the semiconductor elements of an NMOS transistor structure. In this case, a semiconductor element driving circuit makes the OFF operation of a semiconductor element based on an output voltage at "H" (OFF level) determined by the power supply voltage VCC (internal power supply voltage VC2), and makes the ON operation of the semiconductor element based on an output voltage at "L" (ON level) determined by the ground voltage GND (internal ground voltage GD2).

While the invention has been shown and described in detail, the foregoing description is in all aspects illustrative and not restrictive. It is therefore understood that numerous modifications and variations can be devised without departing from the scope of the invention.

What is claimed is:

1. A semiconductor element driving circuit for driving a semiconductor element with a control electrode, on-side electrode, and the other-side electrode, the semiconductor element driving circuit operating by using first and second power supply voltages, the semiconductor element driving circuit comprising:
    a driving section configured to make an ON or OFF operation of said semiconductor element by outputting said first or second power supply voltage as a driving signal at an ON or OFF level to said control electrode of said semiconductor element, the driving section using said first power supply voltage as a voltage for determining the ON level, and said second power supply voltage as a voltage for determining the OFF level; and
    a reference power supply section configured to output a reference voltage as a reference signal to said one-side electrode of said semiconductor element, the reference voltage being obtained by dividing a potential difference between said first and second power supply voltages by a predetermined diving ratio.

2. A semiconductor element driving circuit for driving a semiconductor element with a control electrode, one-side electrode, and the other-side electrode, the semiconductor element driving circuit operating by using first and second power supply voltages, the semiconductor element driving circuit comprising:
    a driving section configured to make an ON or OFF operation of said semiconductor element by outputting said first or second power supply voltage as a driving signal at an ON or OFF level to said control electrode of said semiconductor element, the driving section using a first internal power supply voltage as a voltage for determining the ON level, and a second internal power supply voltage as a voltage for determining the OFF level; and
    a reference power supply section configured to output a reference voltage as a reference signal to said one-side electrode of said semiconductor element, the reference voltage being obtained as an intermediate potential between said first and second power supply voltages,
    wherein a voltage clamped at a level that is made different from said reference voltage by a first level to be closer to said first power supply voltage is specified as said first internal power supply voltage, and a voltage clamped at a level that is made different from said reference signal by a second level to be closer to said second power supply voltage is specified as said second internal power supply voltage.

3. A semiconductor element driving circuit for driving a semiconductor element with a control electrode, one-side electrode, and the other-side electrode, the semiconductor element driving circuit operating by using first and second power supply voltages, the semiconductor element driving circuit comprising:
    a driving section configured to make an ON or OFF operation of said semiconductor element by outputting said first or second power supply voltage as a driving signal at an ON or OFF level to said control electrode of said semiconductor element, the driving section using said first power supply voltage as a voltage for determining the ON level, and said second power supply voltage as a voltage for determining the OFF level;
    a first reference voltage output section configured to output a first reference voltage, the first reference voltage being clamped at a level that is made different from said first power supply voltage by a first level to be closer to said second power supply voltage;
    a second reference voltage output section configured to output a second reference voltage, the second reference voltage being clamped at a level that is made different from said second power supply voltage by a second level to be closer to said first power supply voltage; and
    a reference signal output section for outputting said first reference voltage as a reference signal to said one-side electrode of said semiconductor element at a time when said driving signal is brought to an ON level, and outputting said second reference voltage as said reference signal to said one-side electrode of said semiconductor element at a time when said driving signal is brought to an OFF level.

4. A semiconductor device, comprising
a semiconductor element; and
the semiconductor element driving circuit as recited in claim 1.

5. A semiconductor device, comprising
a semiconductor element; and
the semiconductor element driving circuit as recited in claim 2.

6. A semiconductor device, comprising
a semiconductor element; and
the semiconductor element driving circuit as recited in claim 3.

7. The semiconductor device according to claim 4, wherein said semiconductor element includes a SiC element formed by using silicon carbide.

8. The semiconductor device according to claim 5, wherein said semiconductor element includes a SiC element formed by using silicon carbide.

9. The semiconductor device according to claim 6, wherein said semiconductor element includes a SiC element formed by using silicon carbide.

\* \* \* \* \*